US011092896B2

(12) United States Patent
Takashima

(10) Patent No.: US 11,092,896 B2
(45) Date of Patent: Aug. 17, 2021

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Yuta Takashima, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/889,596

(22) Filed: Jun. 1, 2020

(65) Prior Publication Data

US 2021/0033981 A1 Feb. 4, 2021

(30) Foreign Application Priority Data

Jul. 31, 2019 (JP) .............................. JP2019-141626

(51) Int. Cl.
*G03F 7/20* (2006.01)
*G06T 7/00* (2017.01)
(Continued)

(52) U.S. Cl.
CPC ........ *G03F 7/70033* (2013.01); *G03F 7/7085* (2013.01); *G03F 7/70533* (2013.01);
(Continued)

(58) Field of Classification Search
CPC ............... G03F 7/70033; G03F 7/7085; G03F 7/70858; G03F 7/708; G03F 7/70808; G03F 7/70883; G03F 7/70908; G03F 7/70916; G03F 7/70925; G03F 7/70933; G03F 7/7095; G03F 7/70975; G03F 7/2037;
(Continued)

(56) References Cited

U.S. PATENT DOCUMENTS

2007/0085043 A1 4/2007 Leonardus Franken et al.
2007/0143032 A1* 6/2007 Wieringa ............... G01N 31/22
702/24

(Continued)

FOREIGN PATENT DOCUMENTS

WO 2018/163380 A1 9/2018
WO WO-2019043773 A1 * 3/2019 ......... G03F 7/70033

OTHER PUBLICATIONS

A Search Report issued by the Netherlands Patent Office dated Dec. 9, 2020, which corresponds to Dutch Patent Application No. 2025678 and is related to U.S. Appl. No. 16/889,596 ; with partial English language explanation.

*Primary Examiner* — Christina A Riddle
(74) *Attorney, Agent, or Firm* — Studebaker & Brackett PC

(57) ABSTRACT

An extreme ultraviolet light generation apparatus may include: a chamber device including an internal space; a target supply unit disposed at the chamber device and configured to supply a droplet of a target substance to the internal space; a target collection unit disposed at the chamber device, communicated with the internal space through an opening provided to an inner wall of the chamber device, and configured to collect the droplet passing through the opening; a detection unit disposed at the chamber device and configured to detect the target substance accumulating in the vicinity of the opening of the inner wall; and a control unit configured to stop the target supply unit depending on a result of the detection by the detection unit.

10 Claims, 11 Drawing Sheets

(51) Int. Cl.
*G06T 7/60* (2017.01)
*H05G 2/00* (2006.01)

(52) U.S. Cl.
CPC .......... *G03F 7/70908* (2013.01); *G06T 7/001* (2013.01); *G06T 7/60* (2013.01); *H05G 2/005* (2013.01); *H05G 2/008* (2013.01)

(58) Field of Classification Search
CPC ... G03F 7/2039; G03F 7/70483–70541; G03F 7/7055; G03F 7/70558; G03F 7/70591; H05G 2/00–008; G06T 7/001; G06T 7/60; G06T 2207/30164; G06T 2207/30148
USPC .............. 355/30, 52–55, 67–71, 77; 430/30; 250/492.1, 492.2, 492.22, 493.1, 503.1, 250/504 R, 505.1; 378/34, 35; 315/111.01, 111.21; 313/231.01, 231.31
See application file for complete search history.

(56) References Cited

U.S. PATENT DOCUMENTS

| | | | |
|---|---|---|---|
| 2010/0192973 A1* | 8/2010 | Ueno | G02B 19/0052 134/1.1 |
| 2013/0134326 A1 | 5/2013 | Yabu et al. | |
| 2013/0319466 A1* | 12/2013 | Mizoguchi | G03F 7/70925 134/18 |
| 2019/0094718 A1 | 3/2019 | Yang et al. | |
| 2019/0358952 A1 | 11/2019 | Wakana | |
| 2020/0133137 A1* | 4/2020 | Sugisawa | G03F 7/70175 |

* cited by examiner

EXTREME ULTRAVIOLET LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2019-141626, filed on Jul. 31, 2019, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. Minute fabrication at 10 nm or smaller will be requested in the next generation technology. To meet the request for minute fabrication at 10 nm or smaller, for example, it is desired to develop a semiconductor exposure device including an extreme ultraviolet light generation apparatus configured to generate extreme ultraviolet (EUV) light at a wavelength of 13 nm approximately in combination with reduced projection reflective optics.

EUV light generation devices being developed include a laser produced plasma (LPP) device that uses plasma generated by irradiating a target material with a pulse laser beam.

LIST OF DOCUMENTS

Patent Documents

Patent Document 1: US Published Patent Application No. 2007/0085043
Patent Document 2: US Published Patent Application No. 2013/0134326

SUMMARY

An extreme ultraviolet light generation apparatus according to an aspect of the present disclosure may include: a chamber device including an internal space; a target supply unit disposed at the chamber device and configured to supply a droplet of a target substance to the internal space; a target collection unit disposed at the chamber device, communicated with the internal space through an opening provided to an inner wall of the chamber device, and configured to collect the droplet passing through the opening; a detection unit disposed at the chamber device and configured to detect the target substance accumulating in the vicinity of the opening of the inner wall; and a control unit configured to stop the target supply unit depending on a result of the detection by the detection unit.

An electronic device manufacturing method according to another aspect of the present disclosure may include: generating, with an extreme ultraviolet light generation apparatus, plasma by irradiating a droplet of a target substance with a laser beam, and emitting extreme ultraviolet light generated from the plasma to an exposure apparatus; and exposing, with the exposure apparatus, a photosensitive substrate to the extreme ultraviolet light to manufacture an electronic device, the extreme ultraviolet light generation apparatus including a chamber device including an internal space, a target supply unit disposed at the chamber device and configured to supply the droplet to the internal space, a target collection unit disposed at the chamber device, communicated with the internal space through an opening provided to an inner wall of the chamber device, and configured to collect the droplet passing through the opening, a detection unit disposed at the chamber device and configured to detect the target substance accumulating on the inner wall in the vicinity of the opening of the inner wall, and a control unit configured to stop the target supply unit depending on a result of the detection by the detection unit.

BRIEF DESCRIPTION OF THE DRAWINGS

Embodiments of the present disclosure will be described below as examples with reference to the accompanying drawings.

DESCRIPTION OF EMBODIMENTS

1. Overview
2. Description of electronic device manufacturing apparatus
3. Description of extreme ultraviolet light generation apparatus of comparative example
    3.1 Configuration
    3.2 Operation
    3.3 Problem 4. Description of EUV light generation apparatus of Embodiment 1
 4.1 Configuration
 4.2 Operation
 4.3 Effect
5. Description of EUV light generation apparatus of Embodiment 2
 5.1 Configuration
 5.2 Effect
6. Description of EUV light generation apparatus of Embodiment 3
 6.1 Configuration
 6.2 Effect
7. Description of EUV light generation apparatus of Embodiment 4
 7.1 Configuration
 7.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

The embodiments of the present disclosure relate to an extreme ultraviolet light generation apparatus configured to generate light having a wavelength corresponding to so-called extreme ultraviolet (EUV) light and an electronic device manufacturing apparatus. Hereinafter, extreme ultraviolet light is also referred to as EUV light.

2. Description of Electronic Device Manufacturing Apparatus

Figure 1:
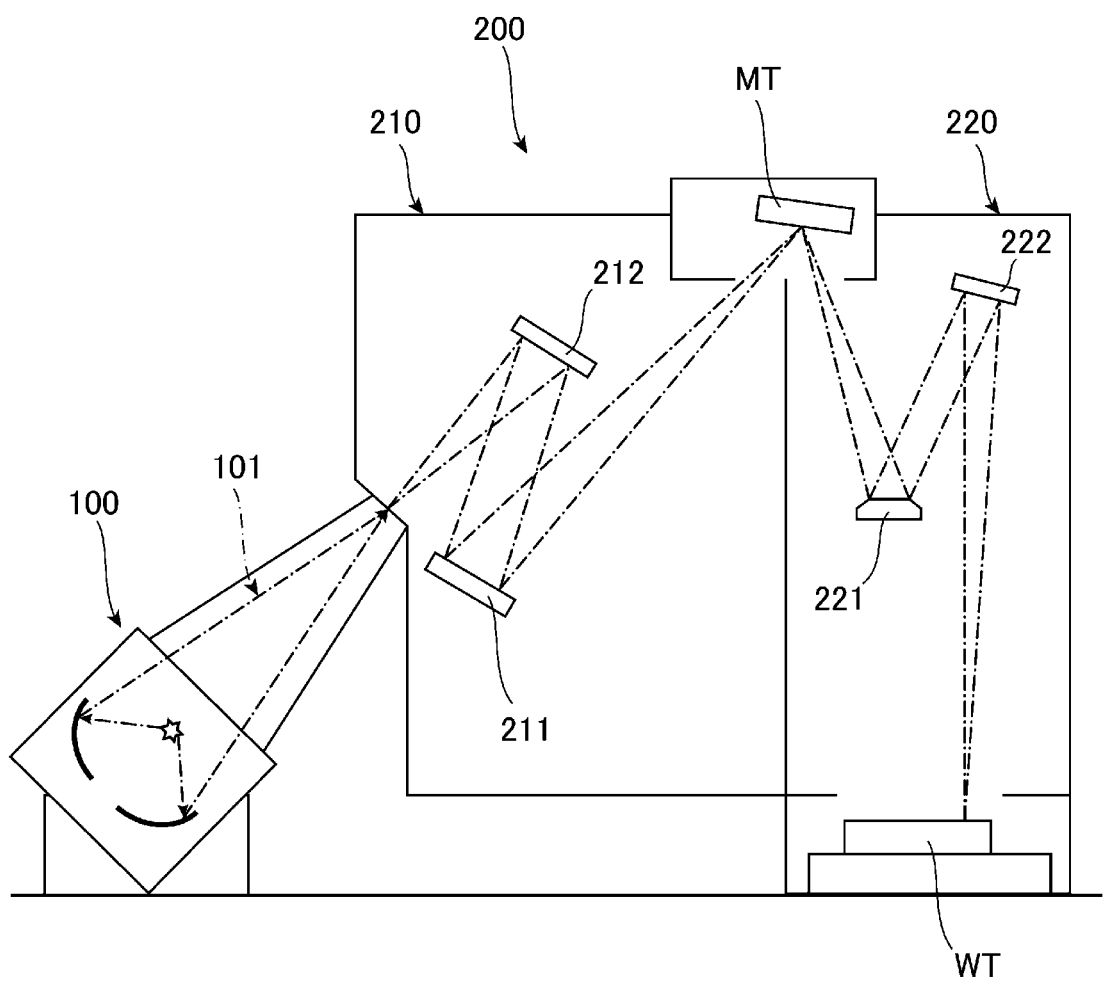
FIG. 1 is a diagram illustrating an exemplary entire schematic configuration of an electronic device manufacturing apparatus.

As illustrated in FIG. 1, the electronic device manufacturing apparatus includes an EUV light generation apparatus 100 and an exposure apparatus 200. The exposure apparatus 200 includes a mask irradiation unit 210 including a plurality of mirrors 211 and 212, and a workpiece irradiation unit 220 including a plurality of mirrors 221 and 222. The mask irradiation unit 210 illuminates, with EUV light 101 incident from the EUV light generation apparatus 100, a mask pattern on a mask table MT through a reflection optical system. The workpiece irradiation unit 220 images, through a reflection optical system, the EUV light 101 reflected by the mask table MT on a workpiece (not illustrated) disposed on a workpiece table WT. The workpiece is a photosensitive substrate such as a semiconductor wafer on which photoresist is applied. The exposure apparatus 200 translates the mask table MT and the workpiece table WT in synchronization with each other to expose the workpiece to the EUV light 101 with the mask pattern reflected. Through an exposure process as described above, a device pattern is transferred onto the semiconductor wafer, thereby manufacturing a semiconductor device.

Figure 2:
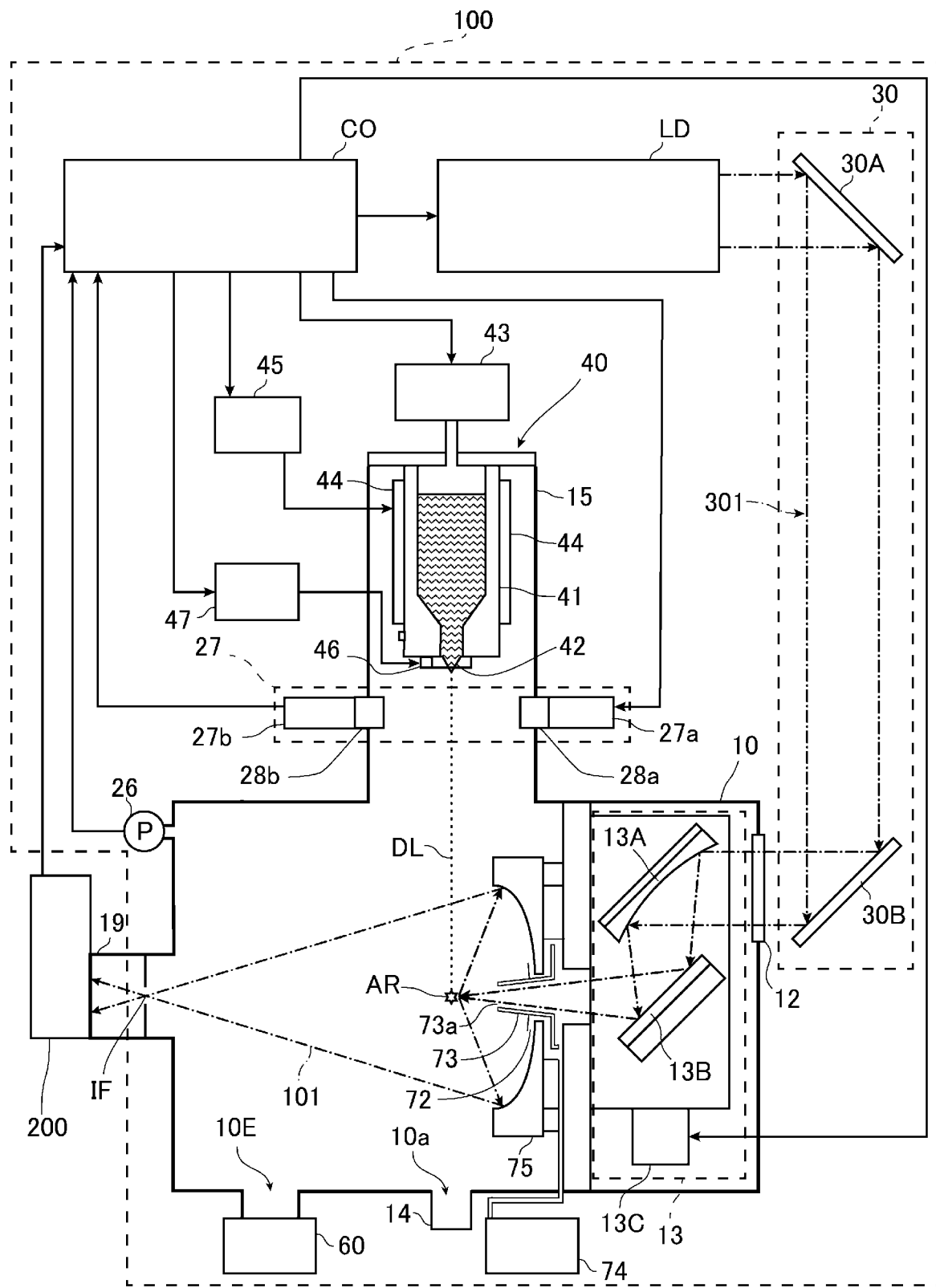
FIG. 2 is a diagram illustrating an exemplary entire schematic configuration of an extreme ultraviolet light generation apparatus.

3. Description of Extreme Ultraviolet Light Generation Apparatus of Comparative Example 3.1 Configuration The following describes an extreme ultraviolet light generation apparatus of a comparative example. FIG. 2 is a pattern diagram illustrating an exemplary entire schematic configuration of the entire extreme ultraviolet light generation apparatus of the present example. As illustrated in FIG. 2, the EUV light generation apparatus 100 of the present embodiment is connected with a laser apparatus LD. The EUV light generation apparatus 100 of the present embodiment includes a chamber device 10, a control unit CO, and a laser beam delivery optical system 30 as main components.

The chamber device 10 is a sealable container. The chamber device 10 includes a sub chamber 15 provided with a target supply unit 40. The target supply unit 40 includes a tank 41 and a nozzle 42. The target supply unit 40 supplies a droplet DL to the internal space of the chamber device 10 and is attached to, for example, penetrate through the wall of the sub chamber 15. The droplet DL, which is also called a target, is supplied from the target supply unit 40.

The tank 41 stores inside a target substance that becomes the droplet DL. The target substance contains tin. The inside of the tank 41 is communicated with, through a pipe, a pressure adjuster 43 configured to adjust gas pressure. In addition, a heater 44 is attached to the tank 41. The heater 44 heats the tank 41 by current supplied from a heater power source 45. Through the heating, the target substance in the tank 41 melts. The pressure adjuster 43 and the heater power source 45 are electrically connected with the control unit CO.

The nozzle 42 is attached to the tank 41 and discharges the target substance. A piezoelectric element 46 is attached to the nozzle 42. The piezoelectric element 46 is electrically connected with a piezoelectric power source 47 and driven by voltage applied from the piezoelectric power source 47. The piezoelectric power source 47 is electrically connected with the control unit CO. The target substance discharged from the nozzle 42 is formed into the droplet DL through operation of the piezoelectric element 46.

In addition, the chamber device 10 includes a target collection unit 14. The target collection unit 14 is a box attached to the inner wall of the chamber device 10. The target collection unit 14 is communicated with the internal space of the chamber device 10 through an opening 10a provided to the inner wall of the chamber device 10. The diameter of the opening 10a is, for example, 28 mm. The target collection unit 14 and the opening 10a are disposed directly below the nozzle 42. The target collection unit 14 is a drain tank configured to collect any unnecessary droplet DL passing through the opening 10a and reaching the target collection unit 14 and accumulate the unnecessary droplet DL.

The wall of the chamber device 10 is provided with at least one through-hole. The through-hole is blocked by a window 12 through which a laser beam 301 emitted in pulses from the laser apparatus LD transmits.

In addition, a laser condensation optical system 13 is disposed in the chamber device 10. The laser condensation optical system 13 includes a laser beam condensation mirror 13A and a high reflectance mirror 13B. The laser beam condensation mirror 13A reflects and condenses the laser beam 301 transmitting through the window 12. The high reflectance mirror 13B reflects the light condensed by the laser beam condensation mirror 13A. The positions of the laser beam condensation mirror 13A and the high reflectance mirror 13B are adjusted by a laser beam manipulator 13C so that a laser focusing position in the chamber device 10 coincides with a position specified by the control unit CO.

For example, an EUV light condensation mirror 75 having a spheroidal surface is disposed inside the chamber device 10. The EUV light condensation mirror 75 has first and second focal points. The EUV light condensation mirror 75 may be disposed so that, for example, the first focal point is positioned in a plasma generation region AR and the second focal point is positioned at an intermediate focus point IF. A through-hole is provided at a central part of the EUV light condensation mirror 75, and the laser beam 301 in pulses passes through the through-hole.

Further, the EUV light generation apparatus 100 includes a connection unit 19 that provides communication between the internal space of the chamber device 10 and the internal space of the exposure apparatus 200. The connection unit 19 includes a wall through which an aperture is formed. The wall is preferably disposed so that the aperture is positioned at the second focal point of the EUV light condensation mirror 75.

Furthermore, the EUV light generation apparatus 100 includes a pressure sensor 26 and a target sensor 27. The pressure sensor 26 and the target sensor 27 are electrically connected with the control unit CO. The pressure sensor 26 measures the pressure in the internal space of the chamber device 10. The target sensor 27 is attached to the chamber device 10. The target sensor 27 has, for example, an image capturing function and detects the existence, trajectory, position, speed, and the like of the droplet DL.

For example, the target sensor 27 includes a light source unit 27a configured to emit light toward the droplet DL, and a detection unit 27b configured to detect light emitted from the light source unit 27a. The light source unit 27a is disposed on a side opposite to the detection unit 27b side with respect to the trajectory of the droplet DL traveling from the nozzle 42 to the target collection unit 14. In other words, the light source unit 27a and the detection unit 27b face each other with the trajectory of the droplet DL interposed therebetween. A window 28a and a window 28b are attached to the inner wall of the chamber device 10. The window 28a is disposed between the light source unit 27a and the trajectory of the droplet DL. The window 28b is disposed between the detection unit 27b and the trajectory of the droplet DL.

The light source unit 27a includes a light source (not illustrated) such as a flash lamp, an illumination optical system (not illustrated) through which light emitted from a light source is condensed onto the trajectory of the droplet DL through the window 28a, and a container (not illustrated) housing the light source and the illumination optical system.

The detection unit 27b includes a light reception optical system (not illustrated), an image capturing unit (not illustrated) such as a charge-coupled device (CCD) or a photodiode, and a container (not illustrated) housing the light reception optical system and the image capturing unit. To improve the accuracy of detection of the droplet DL, the light reception optical system forms an image of the trajectory of the droplet DL and its surroundings onto a light receiving surface of the image capturing unit. When the droplet DL passes through a light condensation region of the light source unit 27a, the image capturing unit detects change of light passing through the trajectory of the droplet DL and its surroundings. The image capturing unit converts the detected change of the light into an electric signal as a signal related to image data of the droplet DL. The image capturing unit outputs the electric signal to the control unit CO.

The laser apparatus LD includes a master oscillator as a light source configured to perform burst operation. The master oscillator emits the laser beam 301 in pulses in a burst-on duration. The master oscillator is, for example, a laser apparatus configured to emit a laser beam by exciting, through electrical discharging, gas as mixture of carbon dioxide gas with helium, nitrogen, or the like. Alternatively, the master oscillator may be a quantum cascade laser apparatus. The master oscillator may emit the laser beam 301 in pulses by a Q switch scheme. The master oscillator may include a light switch, a polarizer, and the like. In the burst operation, the laser beam 301 is emitted in continuous pulses at a predetermined repetition frequency in a burst-on duration and the emission of the laser beam 301 is stopped in a burst-off duration.

The traveling direction of the laser beam 301 emitted from the laser apparatus LD is adjusted through the laser beam delivery optical system 30. The laser beam delivery optical system 30 includes a plurality of mirrors 30A and 30B for adjusting the traveling direction of the laser beam 301, and the position of at least one of the mirrors 30A and 30B is adjusted by an actuator (not illustrated). Through this adjustment of the position of at least one of the mirrors 30A and 30B, the laser beam 301 may propagate into the chamber device 10 through the window 12 appropriately.

The control unit CO may be, for example, a micro controller, an integrated circuit (IC) such as a large-scale integrated circuit (LSI) or an application specific integrated circuit (ASIC), or a numerical control (NC) device. When the control unit CO is a NC device, the control unit CO may or may not include a machine learning device. The control unit CO controls the entire EUV light generation apparatus 100 and also controls the laser apparatus LD. The control unit CO receives, for example, a signal related to the pressure in the internal space of the chamber device 10, which is measured by the pressure sensor 26, a signal related to image data of the droplet DL captured by the target sensor 27, and a burst signal from the exposure apparatus 200. The control unit CO processes the image data and the like and controls the output timing of the droplet DL, the output direction of the droplet DL, and the like. Such various kinds of control are merely exemplary and may include other control as described later.

The following describes the configuration of the chamber device 10 in more detail.

Figure 3:
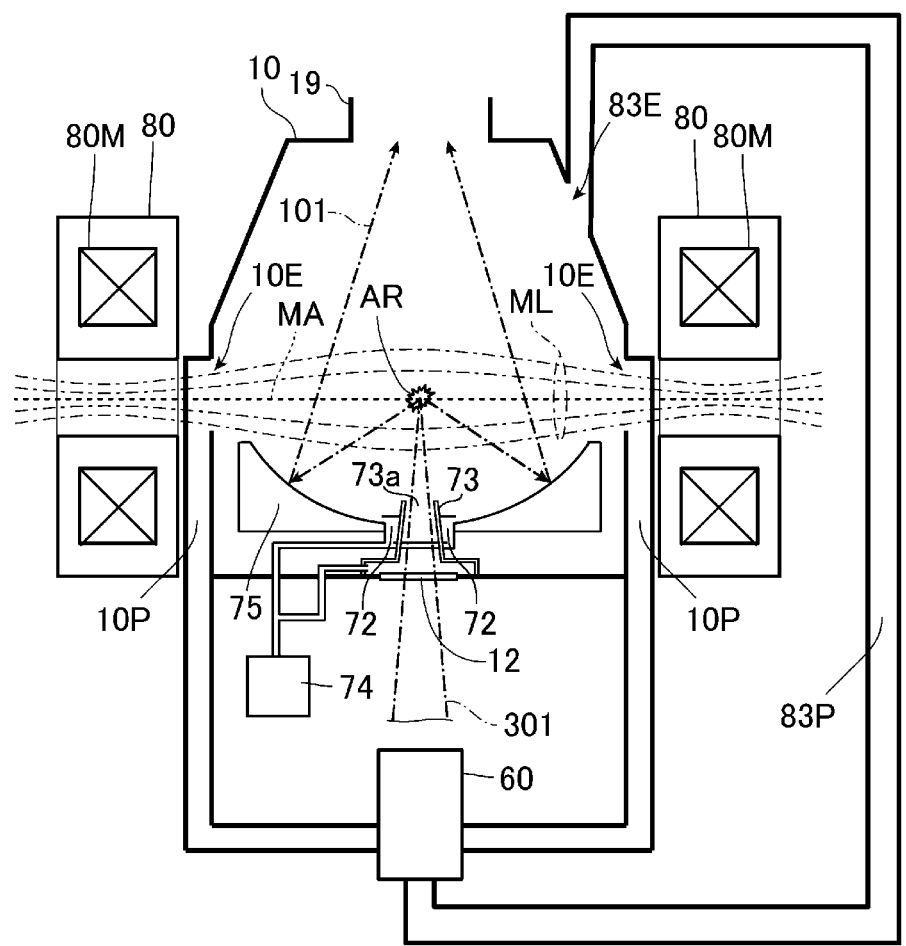
FIG. 3 is a diagram illustrating a partial schematic configuration including a chamber device.

FIG. 3 is a pattern diagram illustrating a partial schematic configuration including the chamber device 10. In FIG. 3, the laser condensation optical system 13 is omitted. As illustrated in FIGS. 2 and 3, a first gas supply unit 72 and a second gas supply unit 73 configured to supply etching gas to the internal space of the chamber device 10 are disposed in the chamber device 10. The first gas supply unit 72 and the second gas supply unit 73 are connected with a gas supply tank 74 configured to supply etching gas through pipes. Since the target substance contains tin as described above, the etching gas is, for example, balance gas having a hydrogen gas concentration of 3% approximately. The balance gas may contain nitrogen ($N_2$) gas or argon (Ar) gas. The pipe between the gas supply tank 74 and at least one of the first gas supply unit 72 and the second gas supply unit 73 may be provided with a supply gas flow amount adjustment unit (not illustrated).

The first gas supply unit 72 is adjusted so that the etching gas supplied into the chamber device 10 flows along the reflective surface from the central axis side of the EUV light condensation mirror 75 toward the outer peripheral part of the EUV light condensation mirror 75. The second gas supply unit 73 has the shape of the side surface of a circular truncated cone and is called a cone in some cases. A gas supply inlet 73a of the second gas supply unit 73 is inserted into a through-hole formed at the EUV light condensation mirror 75, and the gas supply inlet 73a supplies the etching gas through the through-hole in a direction departing from the EUV light condensation mirror 75. The laser beam 301 passes through the through-hole of the EUV light condensation mirror 75 as described above through the second gas supply unit 73. Accordingly, the second gas supply unit 73 has a configuration through which the laser beam 301 can transmit on the window 12 side.

Tin fine particles and tin charged particles are generated when plasma is generated from the target substance forming the droplet DL in the plasma generation region AR. The etching gas supplied from the first gas supply unit 72 and the second gas supply unit 73 contains hydrogen that reacts with tin contained in these fine particles and charged particles. Through the reaction with hydrogen, tin becomes stannane ($SnH_4$) gas at room temperature.

In addition, the EUV light generation apparatus 100 includes a magnetic field generation unit 80. The magnetic field generation unit 80 generates a magnetic field ML for converging the charged particles generated in the plasma generation region AR to a discharge port 10E. The magnetic field generation unit 80 may be configured by, for example, a pair of electromagnets 80M disposed to sandwich facing walls of the chamber device 10. The pair of electromagnets 80M are disposed so that the plasma generation region AR is positioned at the middle of the electromagnets 80M. The direction of current flowing through a superconductive coil of one of the electromagnets 80M is same as the direction of current flowing through a superconductive coil of the other electromagnet 80M. When such current is applied to the pair of superconductive coils, the magnetic field ML is generated at a magnetic flux density that is highest in the vicinity of each electromagnet 80M and decreases toward the plasma generation region AR. A magnetic field axis MA of the magnetic field ML preferably passes across a reflected light path of the EUV light condensation mirror 75 and passes through the plasma generation region AR. The magnetic field ML is called a mirror magnetic field in some cases.

The magnetic field generation unit 80 may generate a magnetic field for converging the charged particles from a side of one of the electromagnets 80M to a side of the other electromagnet 80M through the plasma generation region AR. The magnetic field generation unit 80, which is configured by the pair of electromagnets 80M, may be configured by a pair of permanent magnets. The electromagnets 80M or permanent magnets for generating a magnetic field may be disposed inside the chamber device 10.

Besides, the chamber device 10 includes a pair of discharge ports 10E. Residual gas in the internal space of the chamber device 10, which will be described later, is discharged through the pair of discharge ports 10E. As illustrated in FIG. 3, the discharge ports 10E are disposed, for example, at positions facing each other at the inner wall of the chamber device 10. The pair of discharge ports 10E face each other along the magnetic field axis MA and are disposed at positions through which the magnetic field axis MA passes in the chamber device 10. The discharge ports 10E are connected with discharge pipes 10P, and the discharge pipes 10P are connected with a discharge pump 60.

Moreover, the chamber device 10 includes a discharge port 83E. As illustrated in FIG. 3, the discharge port 83E is disposed at a position on a side opposite to the EUV light condensation mirror 75 side in the chamber device 10 with respect to a surface orthogonal to the optical axis of the EUV light condensation mirror 75 and passing through the discharge ports 10E. As described above, the pair of discharge ports 10E are disposed at the positions through which the magnetic field axis MA passes in the chamber device 10. Thus, when the magnetic field axis MA passes across the reflected light path of the EUV light condensation mirror 75 through the plasma generation region AR, the discharge port 83E is disposed on a side closer to the connection unit 19 as an EUV light emission port than the plasma generation region AR. The discharge port 83E is connected with a discharge pipe 83P. The discharge pipe 83P is connected with the discharge pump 60.

When plasma is generated from the target substance, residual gas as exhaust gas is generated in the internal space of the chamber device 10. The residual gas contains tin fine particles and tin charged particles generated through the plasma generation from the target substance, stannane generated through reaction of the tin fine and charged particles with the etching gas, and unreacted etching gas. Some of the charged particles are neutralized in the chamber device 10, and the residual gas contains the neutralized charged particles as well. The discharge pump 60 sucks in part of the residual gas through the discharge ports 10E and the discharge pipes 10P. Moreover, the discharge pump 60 sucks in the remaining part of the residual gas through the discharge port 83E and the discharge pipe 83P.

3.2 Operation

The following describes operation of the EUV light generation apparatus 100 of the comparative example. In the EUV light generation apparatus 100, an atmosphere in the chamber device 10 is discharged, for example, at new installation or maintenance. In this process, purge and discharge may be repeated in the chamber device 10 to discharge components in the atmosphere. Purge gas is preferably inert gas such as nitrogen ($N_2$) or argon (Ar). Thereafter, when the pressure in the chamber device 10 becomes equal to or smaller than a predetermined pressure, the control unit CO starts introduction of the etching gas from the first gas supply unit 72 and the second gas supply unit 73 into the chamber device 10. In this case, the control unit CO may control the supply gas flow amount adjustment unit (not illustrated) and the discharge pump 60 so that the pressure in the internal space of the chamber device 10 is maintained at the predetermined pressure. Thereafter, the control unit CO waits until a predetermined time elapses since the start of the etching gas introduction.

The control unit CO drives the electromagnets 80M of the magnetic field generation unit 80 to generate the magnetic field ML. In addition, the control unit CO controls the discharge pump 60 to discharge gas in the chamber device 10 through the discharge ports 10E, and maintains the pressure in the chamber device 10 substantially constant based on a signal of the pressure in the chamber device 10 measured by the pressure sensor 26. The pressure in the chamber device 10 in this case is, for example, 10 Pa to 160 Pa.

The control unit CO applies current from the heater power source 45 to the heater 44 to increase the temperature of the heater 44 so that the target substance in the tank 41 is heated to or maintained at a predetermined temperature equal to or higher than the melting point. In this case, the control unit CO controls the temperature of the target substance to the predetermined temperature by adjusting the value of the current applied from the heater power source 45 to the heater 44 based on an output from a temperature sensor (not illustrated). The predetermined temperature is, for example, 250° C. to 290° C. when the target substance is tin.

The control unit CO controls the pressure adjuster 43 to adjust the pressure in the tank 41 so that the target substance being melted is discharged through the hole of the nozzle 42 at a predetermined speed. The target substance discharged through the hole of the nozzle 42 may be in the form of jet. In this case, the control unit CO generates the droplet DL by applying voltage having a predetermined waveform from the piezoelectric power source 47 to the piezoelectric element 46. Vibration of the piezoelectric element 46 can propagate through the nozzle 42 to the target substance discharged from the hole of the nozzle 42. The target substance is divided in a predetermined period by the vibration, and accordingly, the droplet DL is generated from the target substance.

The control unit CO outputs a light emission trigger signal to the laser apparatus LD. Having received the light emission trigger signal, the laser apparatus LD emits the laser beam 301 in pulses. The emitted laser beam 301 is incident on the laser condensation optical system 13 through the laser beam delivery optical system 30 and the window 12. In this case, the control unit CO controls the laser beam manipulator 13C of the laser condensation optical system 13 so that the laser beam 301 condenses in the plasma generation region AR. In addition, the control unit CO controls the laser apparatus LD to emit the laser beam 301 based on a signal from the target sensor 27 so that the droplet DL is irradiated with the laser beam 301. Accordingly, the droplet DL is irradiated in the plasma generation region AR with the laser beam 301 converged by the laser beam condensation mirror 13A. Plasma generated through the irradiation radiates light including EUV light.

Among the light generated in the plasma generation region AR and including EUV light, the EUV light 101 is condensed to the intermediate focus point IF by the EUV light condensation mirror 75 and then incident on the exposure apparatus 200 through the connection unit 19. Thus, the connection unit 19 is an EUV light emission port in the EUV light generation apparatus 100.

When plasma is generated from the target substance, tin charged particles are generated as described above. Each charged particle receives Lorentz force from the magnetic field ML and moves on a trajectory that rotates in a plane orthogonal to a magnetic field line. When the charged particle moving in this manner has a speed component in the direction toward one of the discharge ports 10E, the charged particle moves toward the wall of the chamber device 10 while converging on a helical trajectory along a magnetic field line. Thus, most of the charged particles are induced to the discharge ports 10E provided to the wall of the chamber device 10 near convergence parts of the magnetic field ML and flow into the discharge ports 10E.

In addition, when plasma is generated from the target substance, tin fine particles that are electrically neutral are generated as described above. The fine particles are not affected by the magnetic field ML generated by the magnetic field generation unit 80 and thus diffuse in the chamber device 10. Some of the fine particles diffusing in the chamber device 10 adhere to the reflective surface of the EUV light condensation mirror 75. The fine particles adhering to the reflective surface become stannane through reaction with the etching gas containing hydrogen and supplied from the first gas supply unit 72 and the second gas supply unit 73. Most of the stannane thus obtained through reaction with the etching gas flows into the discharge ports 10E on flow of unreacted etching gas.

Further, at least some of charged particles not converged to the discharge ports 10E by the magnetic field ML and fine particles not adhering to the reflective surface of the EUV light condensation mirror 75 may become stannane through reaction with part of unreacted etching gas flowing in the chamber device 10. Most of the stannane generated through the reaction flows into the discharge ports 10E and the discharge port 83E on flow of unreacted etching gas. Furthermore, at least part of unreacted charged particles, fine particles, and etching gas flow into the discharge ports 10E and the discharge port 83E.

The unreacted etching gas, fine particles, charged particles, stannane, and the like having flowed into the discharge ports 10E and the discharge port 83E flow as exhaust gas into the discharge pump 60 through the discharge pipes 10P and the discharge pipe 83P and are provided with predetermined discharge treatment such as detoxification.

3.3 Problem

Figure 4:
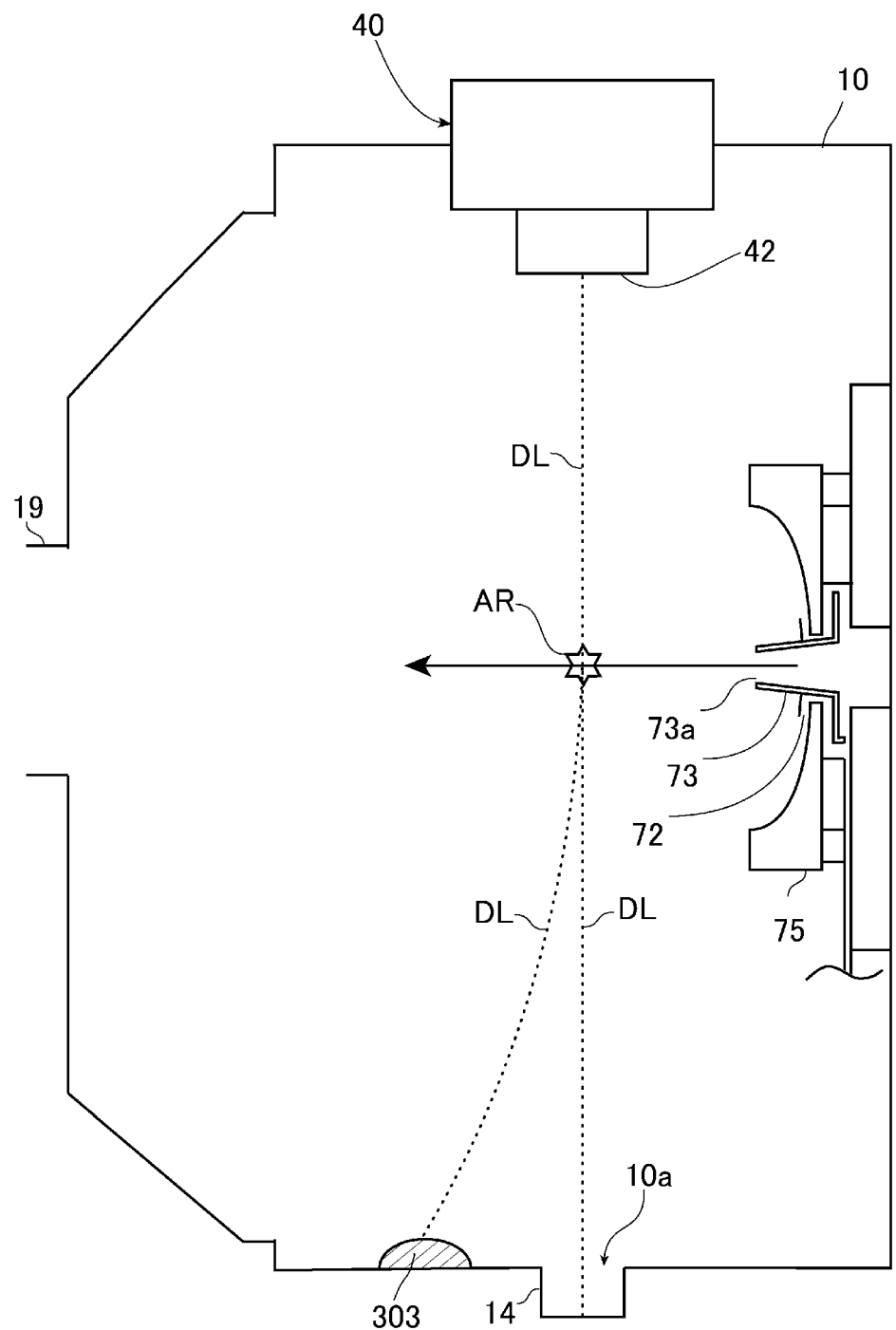
FIG. 4 is a pattern diagram illustrating droplet flow by etching gas in a comparative example and the partial schematic configuration including the chamber device.

In the chamber device 10 of the comparative example, as illustrated in FIG. 4, the target substance is discharged from the nozzle 42, and the droplet DL travels from the nozzle 42 toward the target collection unit 14. In this traveling process, part of the droplet DL does not travel to the target collection unit 14 due to flow of the etching gas supplied into the internal space of the chamber device 10 through the first gas supply unit 72 and the gas supply inlet 73a of the second gas supply unit 73, but flows in an unintended direction in some cases. This flow of the etching gas is indicated by the arrow in FIG. 4. The droplet DL flowing in an unintended direction sometimes accumulates in the vicinity of the opening 10a at the inner wall of the chamber device 10. For example, the droplet DL is likely to accumulate in the vicinity of the opening 10a on a side opposite to the gas supply inlet 73a side with respect to the trajectory of the droplet DL. When the droplet DL continuously accumulates and becomes solidified, a deposit 303 as the accumulation of the target substance is generated.

When the droplet DL continuously accumulates, the deposit 303 gradually swells and becomes a column shape in some cases. When the swelling deposit 303 reaches on the trajectory of the droplet DL, the droplet DL traveling from the nozzle 42 to the target collection unit 14 potentially collides with the deposit 303. Part of the droplet DL having collided is scattered or returned due to the collision and spreads in the internal space of the chamber device 10. The spreading droplet DL adheres to components of the chamber device 10 such as the inner wall and the EUV light condensation mirror 75, which leads to contamination of the chamber device 10. Thus, it has been desired to prevent increase of contamination of the chamber device 10 by detecting the deposit 303 early before reaching on the trajectory of the droplet DL.

The following embodiments exemplarily describe an EUV light generation apparatus that can prevent increase of contamination of a chamber device by detecting a deposit early before reaching on the trajectory of the droplet DL.

4. Description of EUV Light Generation Apparatus of Embodiment 1

The following describes the configuration of an EUV light generation apparatus of Embodiment 1. Any component same as that described above is denoted by an identical reference sign, and duplicate description thereof is omitted unless specific description is needed.

4.1 Configuration

Figure 5:
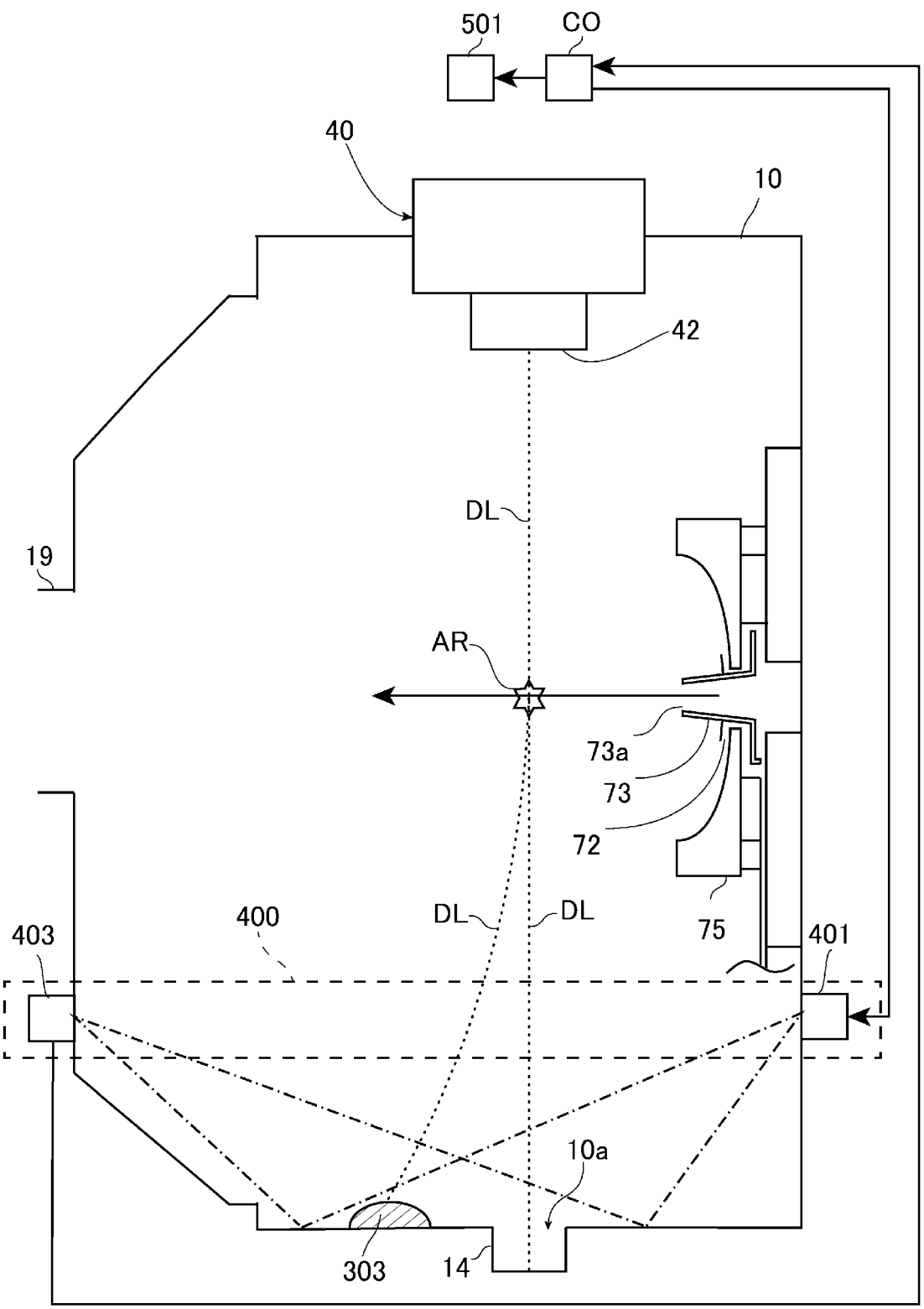
FIG. 5 is a pattern diagram illustrating the partial schematic configuration including the chamber device in Embodiment 1.

FIG. 5 is a pattern diagram illustrating the partial schematic configuration including the chamber device 10 in the EUV light generation apparatus 100 of the present embodiment. In FIG. 5, similarly to FIG. 4, the laser condensation optical system 13, the gas supply tank 74, the magnetic field generation unit 80, the discharge ports 10E and 83E, the discharge pipes 10P and 83P, and the discharge pump 60 are omitted. The chamber device 10 of the present embodiment includes a detection unit 400 and a notification unit 501, which is a main difference from the chamber device 10 of the comparative example.

The detection unit 400 is disposed at the chamber device 10. The detection unit 400 detects the deposit 303 as the target substance accumulating in the vicinity of the opening 10a at the inner wall of the chamber device 10. The vicinity of the opening 10a at the inner wall is, for example, a region within 50 cm from the center of the opening 10a in a plan view of the inner wall along the trajectory of the droplet DL.

Similarly to the comparative example, the gas supply inlet 73a of the second gas supply unit 73 is disposed in the internal space of the chamber device 10. The gas supply inlet 73a is also disposed on a side of the trajectory of the droplet DL traveling from the target supply unit 40 to the target collection unit 14. The gas supply inlet 73a supplies the etching gas toward the internal space as indicated by the arrow in FIG. 5. As described above, the deposit 303 is likely to be generated in the vicinity of the opening 10a on the side opposite to the gas supply inlet 73a with respect to the trajectory of the droplet DL. Thus, the detection unit 400 preferably detects the deposit 303 accumulating in the vicinity of the opening 10a on the side opposite to the gas supply inlet 73a with respect to the trajectory of the droplet DL in the plan view of the inner wall along the trajectory of the droplet DL.

The detection unit 400 of the present embodiment includes a light source unit 401 configured to emit illumination light toward the vicinity of the opening 10a. In view of the above-described part of the droplet DL flowing in an unintended direction, the light source unit 401 preferably emits the illumination light toward the vicinity of the opening 10a on the side opposite to the gas supply inlet 73a with respect to the trajectory of the droplet DL in the plan view of the inner wall along the trajectory of the droplet DL. The light source unit 401 preferably emits illumination light to be reflected by the deposit 303 but unlikely to be reflected by the inner wall. Such illumination light is, for example, visible light, and the inner wall may be coated with aluminum oxide or nickel oxide so that the inner wall is unlikely to reflect the illumination light.

The detection unit 400 of the present embodiment includes an image capturing unit 403 configured to capture reflected light from the vicinity of the opening 10a and the deposit 303 illuminated with the illumination light. For example, the area of an image capturing region of the image capturing unit 403 is equal to the area of an illumination region of the illumination light, and the shape of the image capturing region of the image capturing unit 403 is same as the shape of the illumination region of the illumination light. The image capturing region of the image capturing unit 403 only needs to contain the illumination region of the illumination light. The image capturing unit 403 is, for example, a CCD. The image capturing unit 403 preferably includes a band-pass filter (not illustrated) to avoid influence of plasma generated from the droplet DL irradiated with the laser beam 301. For example, the band-pass filter transmits the reflected light from the deposit 303 and shields plasma light. The image capturing unit 403 converts the reflected light into an electric signal and outputs the obtained electric signal to the control unit CO.

The control unit CO generates a captured image based on the electric signal and analyzes the captured image. The following describes exemplary analysis.

The control unit CO is connected with a memory (not illustrated) storing an initial image. The initial image is, for example, an image of the vicinity of the opening 10a at the inner wall in an allowed state that is allowable as a clean state of the chamber device 10. The allowed state is a state in which no deposit 303 adheres to the vicinity of the opening 10a or a state in which the amount or height of the deposit 303 adhering to the vicinity of the opening 10a is equal to or smaller than an allowable value. The allowable value is set in advance.

The control unit CO compares the deposit 303 in the captured image with the initial image and determines whether the proportion of the deposit 303 in the captured image relative to the initial image is larger than a threshold. The threshold is set in advance and stored in the memory.

When the control unit CO determines that the proportion of the deposit 303 is larger than the threshold, the chamber device 10 is, for example, in a state right before contamination of the chamber device 10 increases. The state right before the contamination is, for example, a state right before the deposit 303 reaches on the trajectory of the droplet DL. Then, the control unit CO outputs, to the exposure apparatus 200 and the notification unit 501, a notification that the EUV light generation apparatus 100 is in an anomalous state. In addition, the control unit CO stops the laser apparatus LD and the target supply unit 40.

When the control unit CO determines that the proportion of the deposit 303 is smaller than the threshold, the chamber device 10 is, for example, in a state not right before contamination of the chamber device 10 increases. The state not right before the contamination is, for example, an allowed state in which the deposit 303 does not sufficiently swell and there is sufficient allowance in time or the amount of accumulation until the deposit 303 reaches on the trajectory of the droplet DL. Then, the control unit CO outputs, to the exposure apparatus 200 and the notification unit 501, a notification that the EUV light generation apparatus 100 is in the normal state. In addition, the control unit CO continues drive of the laser apparatus LD and the target supply unit 40.

The notification unit 501 is a monitor on which the normal state or the anomalous state of the EUV light generation apparatus 100 is displayed, for example, as a character or a symbol to a user, an administrator, or the like. The notification unit 501 only needs to be able to notify the normal state or the anomalous state to the user, the administrator, or the like, and the notification is not limited to a particular scheme but may be performed through, for example, voice, light emission, or light flashing.

4.2 Operation

Figure 6:
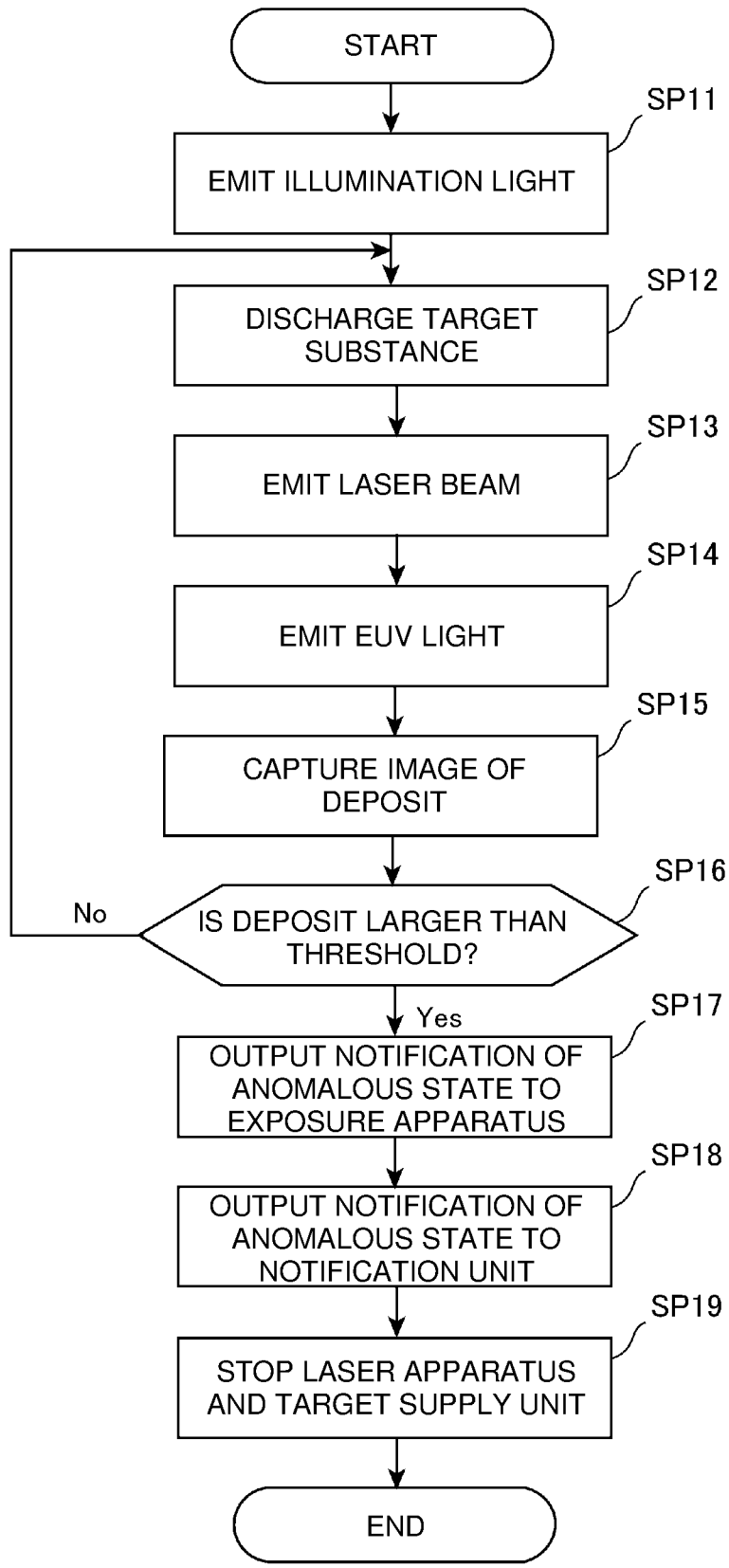
FIG. 6 is a flowchart illustrating operation of a control unit in a state in which a droplet is discharged.

The following describes operation of the EUV light generation apparatus 100 in a state in which the droplet DL is discharged. FIG. 6 is a flowchart illustrating operation of the control unit CO in the state in which the droplet DL is discharged. Before the operation in the flowchart, the discharge of the atmosphere in the chamber device 10, the supply of the etching gas into the chamber device 10, the generation of the magnetic field ML, the adjustment of the pressure in the chamber device 10, and the heating of the target substance, which are described in the comparative example, are performed in the stated order. The operation in the flowchart described below is performed after the heating of the target substance.

(Step SP11)

At the present step, the control unit CO drives the light source unit 401 and the image capturing unit 403. The light source unit 401 emits illumination light toward the inner wall in the vicinity of the opening 10a. In the state of the present step, the droplet DL is yet to be discharged from the nozzle 42 and no deposit 303 adheres to the inner wall in the vicinity of the opening 10a. Accordingly, the image capturing unit 403 does not capture reflected light from the deposit 303 nor convert the reflected light into an electric signal.

(Step SP12)

At the present step, similarly to the comparative example, the control unit CO controls the pressure in the tank 41 through the pressure adjuster 43 so that the target substance being melted is output from the nozzle 42 at the predetermined speed. In this case, the control unit CO generates the droplet DL by applying voltage having a predetermined waveform from the piezoelectric power source 47 to the piezoelectric element 46. Vibration of the piezoelectric element 46 can propagate through the nozzle 42 to the target substance discharged from the hole of the nozzle 42. The target substance is divided in a predetermined period by the vibration, and accordingly, the droplet DL is generated from the target substance. The droplet DL is discharged from the nozzle 42 and travels toward the target collection unit 14.

(Step SP13)

At the present step, similarly to the comparative example, the control unit CO outputs a light emission trigger to the laser apparatus LD. Having received the light emission trigger, the laser apparatus LD emits the laser beam 301 in pulses at a predetermined intensity. Similarly to the comparative example, the laser beam 301 thus emitted is condensed in the plasma generation region AR so that the droplet DL is irradiated with the laser beam 301.

(Step SP14)

At the present step, plasma generated through the irradiation of the droplet DL with the laser beam 301 at step SP13 radiates light including EUV light. Similarly to the comparative example, among the light generated in the plasma generation region AR and including EUV light, the EUV light 101 is incident on the exposure apparatus 200 through the connection unit 19.

(Step SP15)

At steps SP12 to SP14, the droplet DL travels from the nozzle 42 toward the target collection unit 14. In this process, the gas supply inlet 73a supplies the etching gas toward the internal space. In this case, part of the droplet DL sometimes does not travel to the target collection unit 14 but flows in an unintended direction due to flow of the etching gas. The droplet DL flowing in an unintended direction can accumulate on the inner wall in the vicinity of the opening 10a of the chamber device 10, and in such a case, the deposit 303 is generated as described above. The deposit 303 is illuminated with illumination light.

At the present step, the image capturing unit 403 captures reflected light from the deposit 303, converts the reflected light into an electric signal, and outputs the obtained electric signal to the control unit CO. The control unit CO generates a captured image based on the electric signal.

(Step SP16)

At the present step, having generated the captured image, the control unit CO reads the initial image stored in the memory. Subsequently, the control unit CO compares the deposit 303 in the captured image with the initial image and determines whether the proportion of the deposit 303 in the captured image relative to the initial image is larger than a threshold.

When the proportion of the deposit 303 is smaller than the threshold, the control unit CO returns to step SP12.

When the proportion of the deposit 303 is larger than the threshold, the control unit CO proceeds to step SP17.

(Step SP17)

At the present step, the control unit CO outputs, to the exposure apparatus 200, a notification that the EUV light generation apparatus 100 is in an anomalous state.

(Step SP18)

At the present step, the control unit CO outputs, to the notification unit 501, a notification that the EUV light generation apparatus 100 is in an anomalous state. The notification unit 501 notifies that the EUV light generation apparatus 100 is in an anomalous state.

(Step SP19)

At the present step, the control unit CO stops the laser apparatus LD and the target supply unit 40. Thereafter, the deposit 303 is removed from the inner wall of the chamber device 10 by cleaning or the like. When the deposit 303 adheres to a place where the deposit 303 cannot be detected by the detection unit 400, the chamber device 10 may be replaced with a new chamber device 10 to which no deposit 303 adheres.

4.3 Effect

In the present embodiment, the detection unit 400 detects the deposit 303 accumulating in the vicinity of the opening 10a at the inner wall, and the control unit CO stops the target supply unit 40 depending on a result of the detection by the detection unit 400.

In this case, when the target substance accumulates as the deposit 303 in the vicinity of the opening 10a at the inner wall, the deposit 303 is detected early by the detection unit 400 as compared to a case in which no detection unit 400 is disposed, and the target supply unit 40 is stopped so that supply of the droplet DL is stopped. Accordingly, the deposit 303 is prevented from reaching on the trajectory of the droplet DL. In addition, the droplet DL is prevented from spreading across the internal space of the chamber device 10 through collision with the deposit 303 and from adhering to components of the chamber device 10 such as the inner wall and the EUV light condensation mirror 75 due to the spreading, thereby preventing contamination of the chamber device 10 due to the adhesion.

Thus, the EUV light generation apparatus 100 of the present embodiment can prevent increase of contamination of the chamber device 10 by detecting the deposit 303 early before reaching on the trajectory of the droplet DL.

In the present embodiment, the detection unit 400 detects the deposit 303 accumulating in the vicinity of the opening 10a on the side opposite to the gas supply inlet 73a with respect to the trajectory of the droplet DL in the plan view of the inner wall along the trajectory of the droplet DL.

In the present embodiment, part of the droplet DL is likely to accumulate in the vicinity of the opening 10a on the side opposite to the gas supply inlet 73a with respect to the trajectory of the droplet DL in the plan view of the inner wall along the trajectory of the droplet DL, and part of the deposit 303 can accumulate in the vicinity of the opening 10a. Since the deposit 303 accumulating in this manner is detected by the detection unit 400, part of the deposit 303 can be detected early by the detection unit 400 as compared to a case in which no detection unit 400 is disposed. Thus, the EUV light generation apparatus 100 of the present embodiment can prevent increase of contamination of the chamber device 10 by detecting part of the deposit 303 early before reaching on the trajectory of the droplet DL.

In the present embodiment, the detection unit 400 includes the image capturing unit 403. Thus, the EUV light generation apparatus 100 of the present embodiment can capture an image of the deposit 303, and can detect the deposit 303 early as compared to a case in which no image capturing unit 403 is provided. The image capturing unit 403 may have an adjustable image capturing range. Accordingly, the range of detection of the deposit 303 can be adjusted unlike a case in which the image capturing range is fixed.

In the present embodiment, the detection unit 400 includes the light source unit 401. In this case, the image capturing unit 403 can clearly capture an image of the deposit 303 as compared to a case in which no light source unit 401 is disposed. Thus, the EUV light generation apparatus 100 of the present embodiment can accurately detect the deposit 303 as compared to a case in which no light source unit 401 is disposed.

In the present embodiment, the control unit CO analyzes a captured image, and stops the target supply unit 40 depending on a result of the analysis. In this case, the control unit CO can automate the determination of accumulation of the deposit 303. Thus, the EUV light generation apparatus 100 of the present embodiment can reduce a load on an operator or the like for the determination as compared to a case in which no control unit CO is disposed.

In the present embodiment, the control unit CO compares the captured image with the initial image, and stops the target supply unit 40 when the proportion of the deposit 303 in the captured image relative to the initial image is larger than a threshold. In this case, the control unit CO can determine whether there is accumulation of the deposit 303 based on the initial image. Thus, the EUV light generation apparatus 100 of the present embodiment can accurately determine the deposit 303 as compared to a case in which no control unit CO is disposed.

In the present embodiment, the initial image is a first image of a state in which no deposit 303 adheres in the vicinity of the opening 10a, or a second image of a state in which the amount or height of the deposit 303 adhering in the vicinity of the opening 10a is equal to or smaller than an allowable value. When the initial image is the first image, accumulation of the deposit 303 can be immediately detected. When the initial image is the second image, the accuracy of detection of the deposit 303 can be adjusted through adjustment of the allowable value.

In the present embodiment, the analysis is not limited to the above-described example, but is exemplified as follows. The light source unit 401 may emit illumination light to the vicinity of the opening 10a and the deposit 303. The image capturing unit 403 captures reflected light from the vicinity of the opening 10a and the deposit 303, converts the reflected light into an electric signal, and outputs the electric signal to the control unit CO. The control unit CO generates a captured image based on the electric signal. The control unit CO analyzes the proportion of the deposit 303 in the captured image, and stops the target supply unit 40 when the proportion is equal to or larger than a threshold set in advance. The threshold may be stored in the memory.

When a part of the inner wall on which the droplet DL lands can be estimated in advance, the light source unit 401 may emit illumination light toward the estimated landing part, and the image capturing unit 403 may capture an image of the estimated landing part.

5. Description of EUV Light Generation Apparatus of Embodiment 2

The following describes the configuration of the EUV light generation apparatus 100 according to Embodiment 2. Any component same as that described above is denoted by an identical reference sign, and duplicate description thereof is omitted unless specific description is needed.

5.1 Configuration

Figure 7:
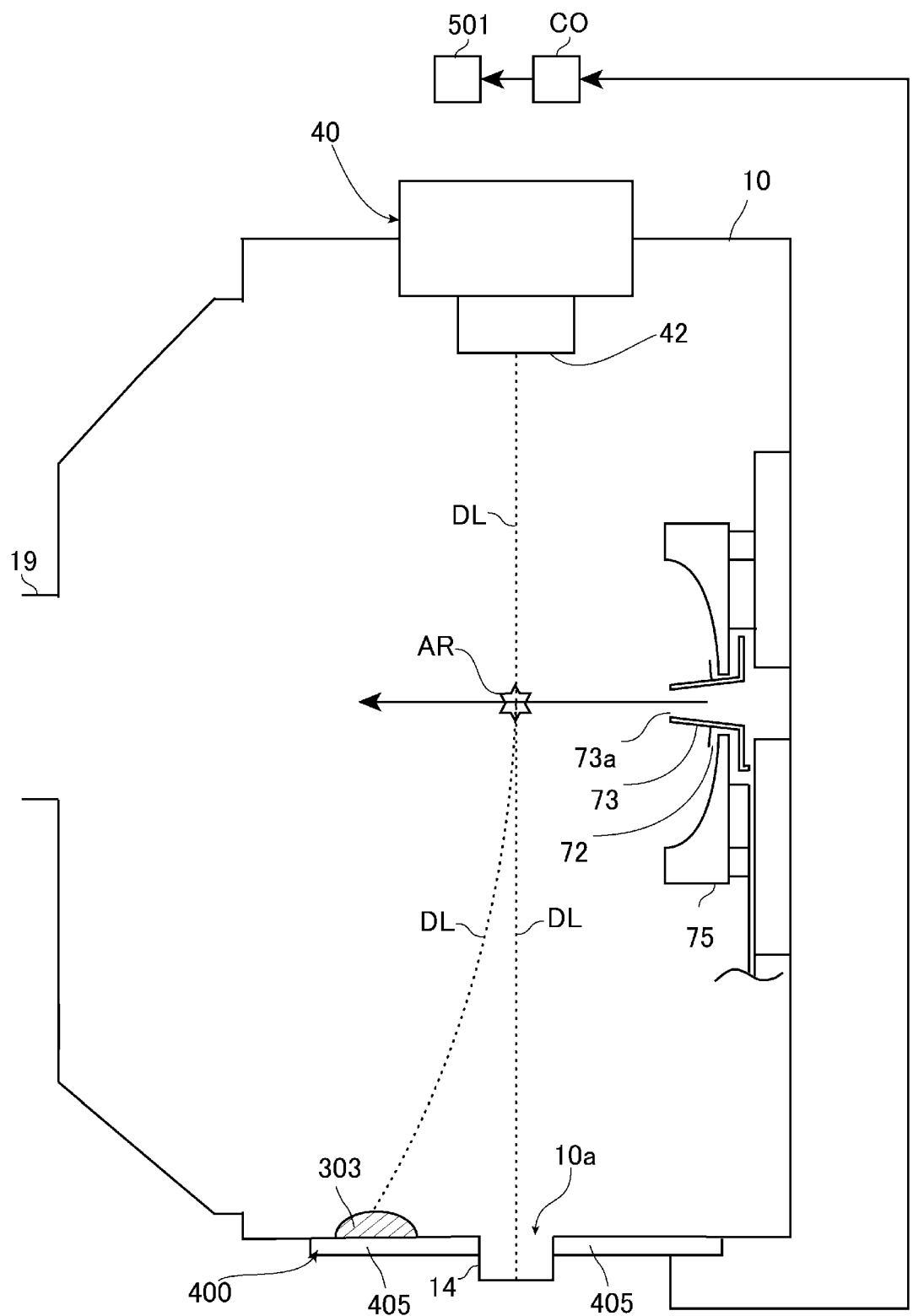
FIG. 7 is a pattern diagram illustrating the partial schematic configuration including the chamber device in Embodiment 2.

FIG. 7 is a pattern diagram illustrating the partial schematic configuration including the chamber device 10 in the EUV light generation apparatus 100 of the present embodiment. In FIG. 7, similarly to FIG. 5, the laser condensation optical system 13, the gas supply tank 74, the magnetic field generation unit 80, the discharge ports 10E and 83E, the discharge pipes 10P and 83P, and the discharge pump 60 are omitted. In the chamber device 10 of the present embodiment, the detection unit 400 is different from the detection unit 400 of Embodiment 1.

Figure 8:
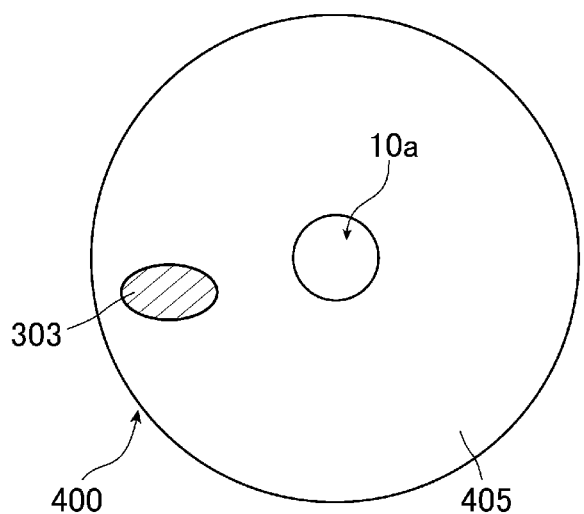
FIG. 8 is a plan view of an electric resistance sensor in the vicinity of an opening along the trajectory of a droplet traveling to a target collection unit in FIG. 7.

The detection unit 400 of the present embodiment includes at least one electric resistance sensor 405 on which the deposit 303 accumulates. The following description is made for a case in which one electric resistance sensor 405 is provided in the vicinity of the opening 10a. As illustrated in FIG. 8, the electric resistance sensor 405 has a ring shape. The electric resistance sensor 405 is centered at the center of the opening 10a.

The electric resistance value of the electric resistance sensor 405 changes depending on the deposit 303 accumulating on the electric resistance sensor 405. For example, when the deposit 303 accumulates on the electric resistance sensor 405, the electric resistance value decreases due to conduction through the deposit 303 as compared to a case in which no deposit 303 accumulates on the electric resistance sensor 405. The electric resistance value is measured by a voltmeter (not illustrated) and output to the control unit CO.

The control unit CO compares the electric resistance value with a threshold. The threshold is set in advance and stored in the memory (not illustrated).

When the control unit CO determines that the electric resistance value is larger than the threshold, the chamber device 10 is, for example, in a state right before contamination of the chamber device 10 increases. Then, similarly to Embodiment 1, the control unit CO outputs, to the exposure apparatus 200 and the notification unit 501, a notification that the EUV light generation apparatus 100 is in an anomalous state. In addition, the control unit CO stops the laser apparatus LD and the target supply unit 40.

When the control unit CO determines that the electric resistance value is smaller than the threshold, the chamber device 10 is, for example, in a state not right before contamination of the chamber device 10 increases. Then, similarly to Embodiment 1, the control unit CO outputs, to the exposure apparatus 200 and the notification unit 501, a notification that the EUV light generation apparatus 100 is in the normal state. In addition, the control unit CO continues drive of the laser apparatus LD and the target supply unit 40.

5.2 Effect

In the present embodiment, the deposit 303 contains tin, and the electric resistance value of the electric resistance sensor 405 may change depending on the deposit 303 accumulating on the electric resistance sensor 405. Thus, the EUV light generation apparatus 100 of the present embodiment can detect accurately and swiftly the deposit 303 containing tin as compared to a case in which no electric resistance sensor 405 is disposed.

In the present embodiment, the electric resistance sensor 405 in a ring shape is centered at the center of the opening 10a. Thus, in the EUV light generation apparatus 100 of the present embodiment, the electric resistance sensor 405 can be easily disposed.

In the present embodiment, the control unit CO stops the target supply unit 40 depending on a result of comparison of the electric resistance value with a threshold. In this case, the control unit CO can automate the determination of accumulation of the deposit 303. Thus, the EUV light generation apparatus 100 of the present embodiment can reduce a load on the operator for the determination as compared to a case in which no control unit CO is disposed.

Figure 9:
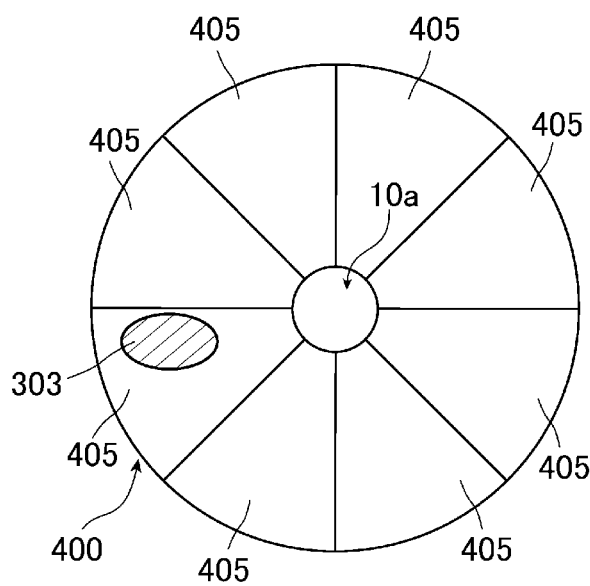
FIG. 9 is a diagram illustrating an example of the electric resistance sensor illustrated in FIG. 8.

As illustrated in FIG. 9, a plurality of electric resistance sensors 405 may be provided and disposed on a concentric circle centered at the center of the opening 10a. In this case, the electric resistance sensors 405 adjacent to each other are insulated from each other and electrically independent. The electric resistance sensors 405 adjacent to each other preferably closely contact each other with no gap therebetween. The control unit CO performs the comparison for each electric resistance sensor 405. In the present example, a detection area in which the deposit 303 is detected is divided for the electric resistance sensors 405, and thus accumulation of the deposit 303 can be detected in each divided detection area. Thus, the position of the accumulating deposit 303 can be detected, and accordingly, the deposit 303 can be accurately detected as compared to a case in which no electric resistance sensor 405 is disposed.

6. Description of EUV Light Generation Apparatus of Embodiment 3

The following describes the configuration of the EUV light generation apparatus 100 according to Embodiment 3. Any component same as that described above is denoted by an identical reference sign, and duplicate description thereof is omitted unless specific description is needed.

6.1 Configuration

Figure 10:
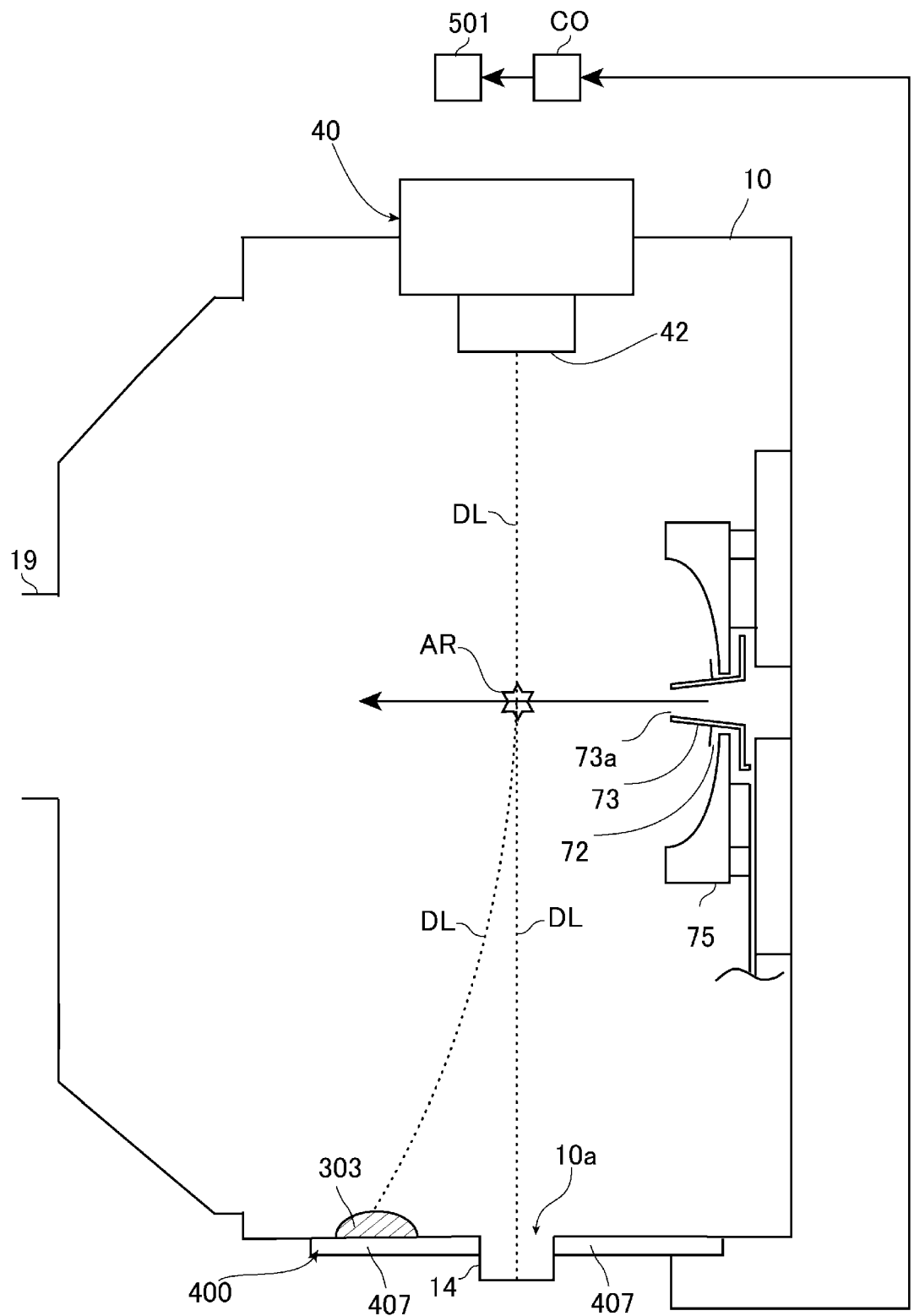
FIG. 10 is a pattern diagram illustrating the partial schematic configuration including the chamber device in Embodiment 3.

FIG. 10 is a pattern diagram illustrating the partial schematic configuration including the chamber device 10 in the EUV light generation apparatus 100 of the present embodiment. In FIG. 10, similarly to FIG. 5, the laser condensation optical system 13, the gas supply tank 74, the magnetic field generation unit 80, the discharge ports 10E and 83E, the discharge pipes 10P and 83P, and the discharge pump 60 are omitted. In the chamber device 10 of the present embodiment, the detection unit 400 is different from the detection unit 400 of each of Embodiments 1 and 2.

Figure 11:
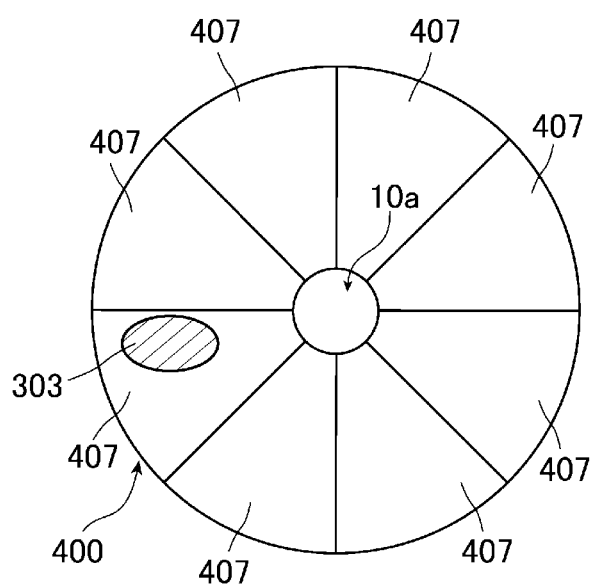
FIG. 11 is a plan view of a pressure sensor in the vicinity of the opening along the trajectory of a droplet traveling to the target collection unit in FIG. 10.

The detection unit 400 of the present embodiment includes a plurality of pressure sensors 407 configured to measure pressure from the deposit 303. As illustrated in FIG. 11, the pressure sensors 407 are each provided in a sheet shape in the vicinity of the opening 10a and disposed on a concentric circle centered at the center of the opening 10a. The pressure sensors 407 adjacent to each other are independent from each other. The pressure sensors 407 adjacent to each other closely contact each other with no gap therebetween.

The mass of the deposit 303 when the deposit 303 reaches the trajectory of the droplet DL is, for example, 1 g to 10 g. Thus, each pressure sensor 407 preferably has a measurement range of 100 mg to 10 g.

Besides, the contact area of the deposit 303 in contact with the inner wall when the deposit 303 reaches the trajectory of the droplet DL is, for example, 10 cm$^2$ to 50 cm$^2$. Thus, the area of each pressure sensor 407 is preferably 50 cm$^2$ to 200 cm$^2$.

Each pressure sensor 407 converts the measured pressure into an electric signal and outputs the electric signal to the control unit CO.

The control unit CO calculates the mass of the deposit 303 based on the electric signal from the pressure sensor 407. The following describes calculation of the mass of the deposit 303.

As described in the comparative example, the pressure in the internal space of the chamber device 10 is maintained at a predetermined pressure. Thus, when the pressure sensor 407 measures the pressure from the deposit 303, the pressure in the internal space on the pressure sensor 407 needs to be taken into account.

In the following, X(t) represents the pressure measured by each pressure sensor 407, P(t) represents the pressure in the internal space, S represents the area of the pressure sensor 407, M(t) represents the mass of the deposit 303 accumulating on the pressure sensor 407, and g represents the gravitational acceleration. The area S and the gravitational acceleration g are known.

The pressure X(t) is calculated by Expression (1) below.

$$X(t) = P(t) \times S + M(t) \times g \quad (1)$$

As understood from Expression (1), when the deposit 303 adheres to the pressure sensor 407, the pressure X(t) is based on the pressure P(t) in the internal space and the mass M(t) of the deposit 303.

In Expression (1), when no deposit 303 adheres to the pressure sensor 407, the mass M(t) of the deposit 303 is zero. In such a case, the control unit CO calculates pressure X(0) from Expression (2) below by using Expression (1).

$$X(0) = P(t) \times S \quad (2)$$

As understood from Expression (2), when no deposit 303 adheres to the pressure sensor 407, the pressure X(0) measured by the pressure sensor 407 is based on the pressure P(t) in the internal space.

Subsequently, the control unit CO calculates the pressure P(t) in the internal space from Expression (2) and obtains Expression (3) below.

$$P(t) = X(0)/S \quad (3)$$

Subsequently, the control unit CO calculates the mass M(t) of the deposit 303 from Expression (1) and obtains Expression (4) below.

$$M(t) = (X(t) - P(t) \times S)/g \quad (4)$$

The control unit CO substitutes Expression (3) into Expression (4) and obtains Expression (5) below.

$$M(t) = (X(t) - X(0))/g \quad (5)$$

Thus, the control unit CO calculates the mass M(t) of the deposit 303 based on the pressure X(t) and the pressure X(0).

The control unit CO compares the mass of the deposit 303 calculated from Expression (5) with a threshold. The threshold is set in advance and stored in the memory. The control unit CO performs the comparison for each pressure sensor 407.

When the control unit CO determines that the mass of the deposit 303 is larger than the threshold, the chamber device 10 is, for example, in a state right before contamination of the chamber device 10 increases. Then, similarly to Embodiment 1, the control unit CO outputs, to the exposure apparatus 200 and the notification unit 501, a notification that the EUV light generation apparatus 100 is in an anomalous state. In addition, the control unit CO stops the laser apparatus LD and the target supply unit 40.

When the control unit CO determines that the mass of the deposit 303 is smaller than the threshold, the chamber device 10 is, for example, in a state not right before contamination of the chamber device 10 increases. Then, similarly to Embodiment 1, the control unit CO outputs, to the exposure apparatus 200 and the notification unit 501, a notification that the EUV light generation apparatus 100 is in the normal state. In addition, the control unit CO continues drive of the laser apparatus LD and the target supply unit 40.

6.2 Effect

In the present embodiment, the pressure from the deposit 303 are measured by the pressure sensors 407. Thus, the EUV light generation apparatus 100 of the present embodiment can accurately and swiftly detect the deposit 303 as compared to a case in which no pressure sensors 407 are disposed.

In the present embodiment, the pressure sensors 407 are disposed on a concentric circle centered at the center of the opening 10a. Since the detection area in which the deposit 303 is detected is divided for the pressure sensors 407, the deposit 303 can be detected in each divided detection area. Thus, the position of the accumulating deposit 303 can be detected, and accordingly, the deposit 303 can be accurately detected as compared to a case in which no pressure sensors 407 are disposed.

In the present embodiment, the control unit CO calculates the mass of the deposit 303 from Expression (5). In this case, the control unit CO can be prevented from falsely detecting the pressure in the internal space as the pressure from the deposit 303. Thus, the EUV light generation apparatus 100 of the present embodiment can accurately detect the mass of the deposit 303. In addition, in the present embodiment, the control unit CO stops the target supply unit 40 depending on a result of comparison of the mass of the deposit 303 with a threshold. In this case, the control unit CO can automate the determination of accumulation of the deposit 303. Thus, the EUV light generation apparatus 100 of the present embodiment can reduce a load on the operator for the determination as compared to a case in which no control unit CO is disposed.

7. Description of EUV Light Generation Apparatus of Embodiment 4

The following describes the configuration of the EUV light generation apparatus 100 according to Embodiment 4. Any component same as that described above is denoted by an identical reference sign, and duplicate description thereof is omitted unless specific description is needed.

7.1 Configuration

Figure 12:
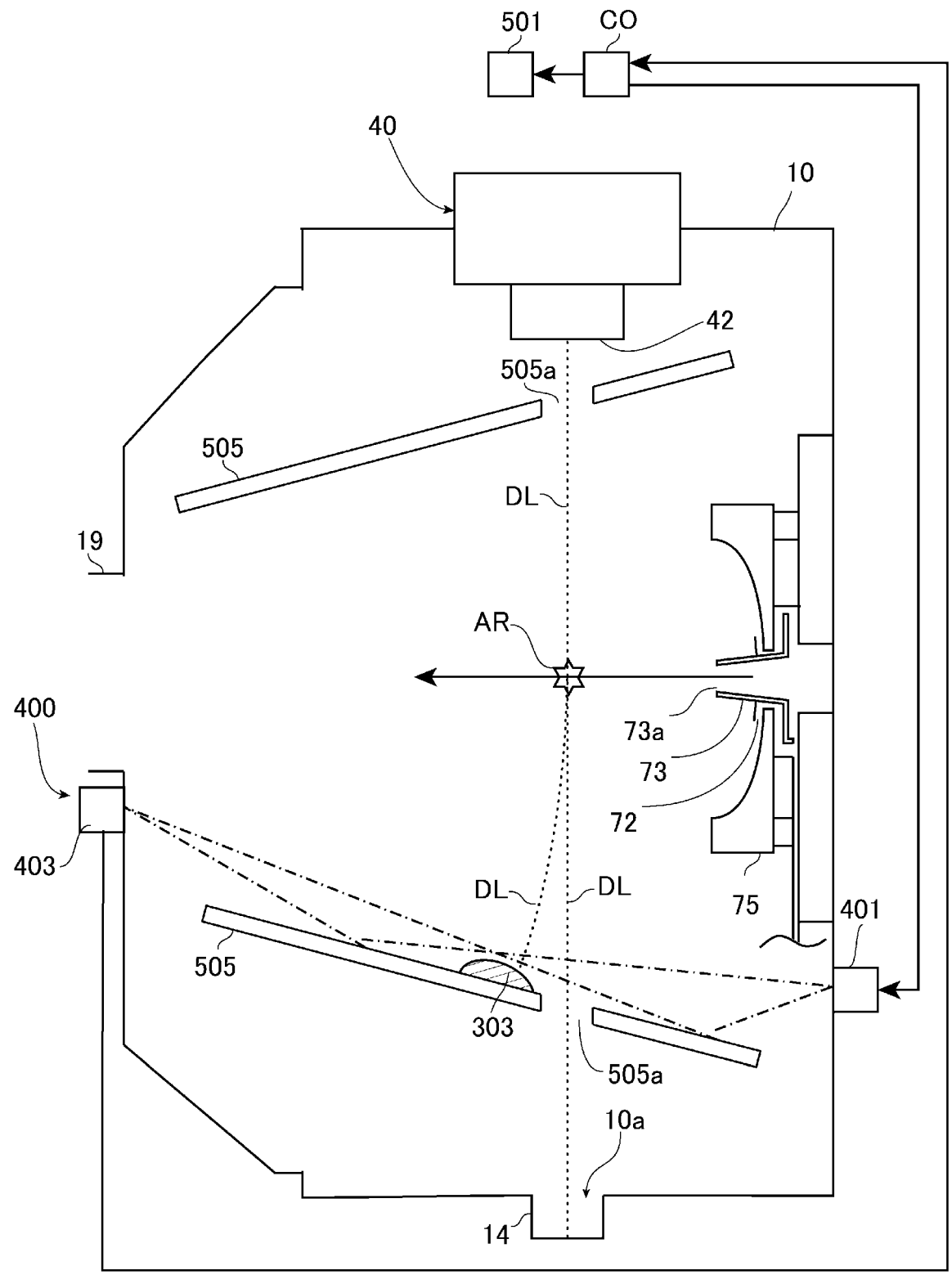
FIG. 12 is a pattern diagram illustrating the partial schematic configuration including the chamber device in Embodiment 4.

FIG. 12 is a pattern diagram illustrating the partial schematic configuration including the chamber device 10 in the EUV light generation apparatus 100 of the present embodiment. In FIG. 12, similarly to FIG. 4, the laser condensation optical system 13, the gas supply tank 74, the magnetic field generation unit 80, the discharge ports 10E and 83E, the discharge pipes 10P and 83P, and the discharge pump 60 are omitted. In the present embodiment, the detection unit 400 is same as the detection unit 400 of Embodiment 1, and the chamber device 10 of the present embodiment also includes a heat shield 505 in addition to the configuration of the chamber device 10 of Embodiment 1.

For example, the heat shield 505 has a tubular shape and houses the plasma generation region AR. The heat shield 505 reduces heat transferred from the plasma generation region AR to the inner wall of the chamber device 10. The heat shield 505 is disposed between the plasma generation region AR and the target collection unit 14 in the internal space of the chamber device 10. The heat shield 505 has a pair of through-holes 505a through which the droplet DL passes. The through-holes 505a are disposed on the trajectory of the droplet DL.

In the present embodiment, the surface of the heat shield 505 on the plasma generation region AR side is an inner wall on which the deposit 303 accumulates. Thus, the light source unit 401 emits illumination light toward the surface of the heat shield 505 on the plasma generation region AR side in the vicinity of each through-hole 505a. To avoid the above-described part of the droplet DL flowing in an unintended direction, the light source unit 401 preferably emits illumination light toward the surface on the plasma generation region AR side on the side opposite to the gas supply inlet 73a with respect to the trajectory of the droplet DL in the plan view of the inner wall along the trajectory of the droplet DL. The image capturing unit 403 captures an image of the surface of the heat shield 505 on the plasma generation region AR side in the vicinity of each through-hole 505a.

7.2 Effect

In the present embodiment, the gas supply inlet 73a supplies the etching gas toward the inner side of the heat shield 505. Thus, due to flow of the etching gas, the droplet DL potentially accumulates on the surface of the heat shield 505 on the plasma generation region AR side as the inner wall in the vicinity of one of the through-holes 505a without traveling to the target collection unit 14 through the through-holes 505a. In this case as well, the detection unit 400 detects the deposit 303 accumulating on the surface on the plasma generation region AR side, and the control unit CO stops the target supply unit 40 depending on a result of the detection by the detection unit 400.

In the present embodiment, the deposit 303 is detected early by the detection unit 400 as compared to a case in which no detection unit 400 is disposed, and the target supply unit 40 is stopped so that supply of the droplet DL is stopped. Accordingly, the deposit 303 is prevented from reaching on the trajectory of the droplet DL. Further, the droplet DL is prevented from spreading across the internal space of the chamber device 10 through collision with the deposit 303 and from adhering to the heat shield 505 due to the spreading, thereby preventing contamination of the chamber device 10 due to the adhesion.

The heat shield 505 may be combined with the configurations of Embodiments 2 and 3. In such a case, in Embodiment 2, the electric resistance sensor 405 is disposed on a concentric circle centered at the center of one of the through-holes 505a on the surface of the heat shield 505 on the plasma generation region AR side. In Embodiment 3, the pressure sensors 407 are disposed on a concentric circle centered at the center of one of the through-holes 505a on the surface of the heat shield 505 on the plasma generation region AR side.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms, unless otherwise specified. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus comprising:
 a chamber device including an internal space;
 a target supply unit disposed at the chamber device and configured to supply a droplet of a target substance to the internal space;

a target collection unit disposed at the chamber device, communicated with the internal space through an opening provided to an inner wall of the chamber device, and configured to collect the droplet passing through the opening;

a detection unit disposed at the chamber device and configured to detect the target substance accumulating in a vicinity of the opening of the inner wall; and a control unit configured to stop the target supply unit depending on a result of the detection by the detection unit, wherein the target substance contains tin, the detection unit includes at least one electric resistance sensor provided in the vicinity of the opening, and an electric resistance value of the electric resistance sensor changes depending on the target substance accumulating on the electric resistance sensor.

2. The extreme ultraviolet light generation apparatus according to claim 1, wherein a number of the electric resistance sensors is one, and the one electric resistance sensor has a ring shape centered at the center of the opening.

3. The extreme ultraviolet light generation apparatus according to claim 1, wherein a plurality of the electric resistance sensors are provided and disposed on a concentric circle centered at the center of the opening.

4. The extreme ultraviolet light generation apparatus according to claim 1, wherein the control unit compares the electric resistance value with a threshold and stops the target supply unit depending on a result of the comparison.

5. The extreme ultraviolet light generation apparatus according to claim 1, wherein the chamber device includes a plasma generation region that is disposed in the internal space and in which plasma is generated from the droplet irradiated with a laser beam, and a heat shield having a through-hole through which the droplet passes and disposed in the internal space between the plasma generation region and the target collection unit to reduce heat transferred from the plasma generation region to the chamber device, and the inner wall is a surface of the heat shield on a side of the plasma generation region.

6. The extreme ultraviolet light generation apparatus according to claim 1, further comprising a laser apparatus configured to emit a laser beam toward the droplet, wherein the control unit stops drive of the laser apparatus depending on the result of the detection.

7. An extreme ultraviolet light generation apparatus comprising:

a chamber device including an internal space;

a target supply unit disposed at the chamber device and configured to supply a droplet of a target substance to the internal space;

a target collection unit disposed at the chamber device, communicated with the internal space through an opening provided to an inner wall of the chamber device, and configured to collect the droplet passing through the opening;

a detection unit disposed at the chamber device and configured to detect the target substance accumulating in a vicinity of the opening of the inner wall; and a control unit configured to stop the target supply unit depending on a result of the detection by the detection unit, wherein the detection unit includes a plurality of pressure sensors provided in the vicinity of the opening.

8. The extreme ultraviolet light generation apparatus according to claim 7, wherein the pressure sensors are disposed on a concentric circle centered at the center of the opening.

9. The extreme ultraviolet light generation apparatus according to claim 7, wherein the control unit calculates a mass of the target substance accumulating on the pressure sensors based on signals from the pressure sensors, compares the mass with a threshold, and stops the target supply unit depending on a result of the comparison.

10. An electronic device manufacturing method comprising:

generating, with an extreme ultraviolet light generation apparatus, plasma by irradiating a droplet of a target substance with a laser beam and emitting extreme ultraviolet light generated from the plasma to an exposure apparatus; and exposing, with the exposure apparatus, a photosensitive substrate to the extreme ultraviolet light to manufacture an electronic device, the extreme ultraviolet light generation apparatus including a chamber device including an internal space, a target supply unit disposed at the chamber device and configured to supply the droplet to the internal space, a target collection unit disposed at the chamber device, communicated with the internal space through an opening provided to an inner wall of the chamber device, and configured to collect the droplet passing through the opening, a detection unit disposed at the chamber device and configured to detect the target substance accumulating in a vicinity of the opening of the inner wall, and a control unit configured to stop the target supply unit depending on a result of the detection by the detection unit, wherein the target substance contains tin, the detection unit includes at least one electric resistance sensor provided in the vicinity of the opening, and an electric resistance value of the electric resistance sensor changes depending on the target substance accumulating on the electric resistance sensor.

* * * * *